ID 057B2

United States Patent
Miyata (10) Patent No.: US 11,381,057 B2
(45) Date of Patent: Jul. 5, 2022

(54) LIGHT SOURCE DEVICE (71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 78 days.

(21) Appl. No.: 17/060,881

(22) Filed: Oct. 1, 2020

(65) Prior Publication Data

US 2021/0119409 A1 Apr. 22, 2021

(30) Foreign Application Priority Data

Oct. 18, 2019 (JP) .............................. JP2019-190888

(51) Int. Cl.
*H01S 5/026* (2006.01)
*H01S 5/02257* (2021.01)
*H01S 5/062* (2006.01)

(52) U.S. Cl.
CPC ........ *H01S 5/0264* (2013.01); *H01S 5/02257* (2021.01); *H01S 5/06236* (2013.01)

(58) Field of Classification Search
CPC ... H01S 5/06236; H01S 5/0264; H01S 5/4093
USPC ........................................................ 372/109
See application file for complete search history.

(56) References Cited

U.S. PATENT DOCUMENTS

| 4,338,577 | A | * | 7/1982 | Sato | .................... H01S 5/02212 |
| | | | | | 372/44.01 |
| 2005/0169644 | A1 | * | 8/2005 | Ueno | .................. H04B 10/503 |
| | | | | | 398/201 |
| 2005/0178945 | A1 | | 8/2005 | Oka et al. | |
| 2019/0035700 | A1 | | 1/2019 | Murayama et al. | |
| 2019/0148908 | A1 | * | 5/2019 | Halbritter | ........... H01S 5/02255 |
| | | | | | 372/43.01 |
| 2019/0259917 | A1 | | 8/2019 | Yamanaka et al. | |

FOREIGN PATENT DOCUMENTS

| JP | S6159368 U | 4/1986 |
| JP | H05-19197 A | 1/1993 |
| JP | 2004-087816 A | 3/2004 |
| JP | 2005-150379 A | 6/2005 |
| JP | 2005-235276 A | 9/2005 |
| JP | 2006-322916 A | 11/2006 |
| JP | 2012-039054 A | 2/2012 |
| WO | WO-2017/149573 A1 | 9/2017 |
| WO | WO-2018/084101 A1 | 5/2018 |

\* cited by examiner

*Primary Examiner* — Tuan N Nguyen
(74) *Attorney, Agent, or Firm* — Foley & Lardner LLP (57) ABSTRACT

A light source device includes: a laser diode configured to emit laser light; a substrate directly or indirectly supporting the laser diode; a glass cap secured to the substrate and covering the laser diode, the glass cap comprising a front glass wall configured to transmit the laser light that is emitted from the laser diode, the front glass wall having an incident surface on which the laser light is incident and an emission surface from which the laser light exits; and a photodetector directly or indirectly supported by the substrate and located outside of the glass cap. The photodetector is configured to detect light reflected at the front glass wall and is transmitted through the glass cap.

10 Claims, 9 Drawing Sheets

LIGHT SOURCE DEVICE

CROSS-REFERENCE TO RELATED APPLICATION

This application claims priority to Japanese Patent Application No. 2019-190888, filed on Oct. 18, 2019, the entire contents of which are hereby incorporated by reference.

BACKGROUND

The present disclosure relates to a light source device that includes a laser diode.

Applications for light source devices that include a laser diode as a light-emitting device are expanding into various fields. For example, display devices having a display part at a location near the eyes of a user (so-called near-eye displays), e.g., head-mounted displays (HMD), requires a small-sized light source device. For example, PCT Publication No. WO 2017/149573 describes a light source device appropriate for reduction in size. This light source device in PCT Publication No. WO 2017/149573 has a structure in which a glass cap having a substantially rectangular-parallelepiped outer shape covers a laser diode on a substrate.

SUMMARY

The present disclosure provides a light source device that allows the intensity of laser light to be monitored with a high accuracy.

A light source device according to certain embodiments of the present disclosure includes: a laser diode configured to emit laser light; a substrate directly or indirectly supporting the laser diode; a glass cap secured to the substrate and covering the laser diode, the glass cap comprising a front glass wall configured to transmit the laser light that is emitted from the laser diode, the front glass wall having an incident surface on which the laser light is incident and an emission surface from which the laser light exits; and a photodetector directly or indirectly supported by the substrate and located outside of the glass cap. The photodetector is configured to detect light reflected at the front glass wall and is transmitted through the glass cap.

According to certain embodiments of the present disclosure, a light source device that allows the intensity of laser light to be monitored with a high accuracy can be obtained.

DETAILED DESCRIPTION

Figure 1A:
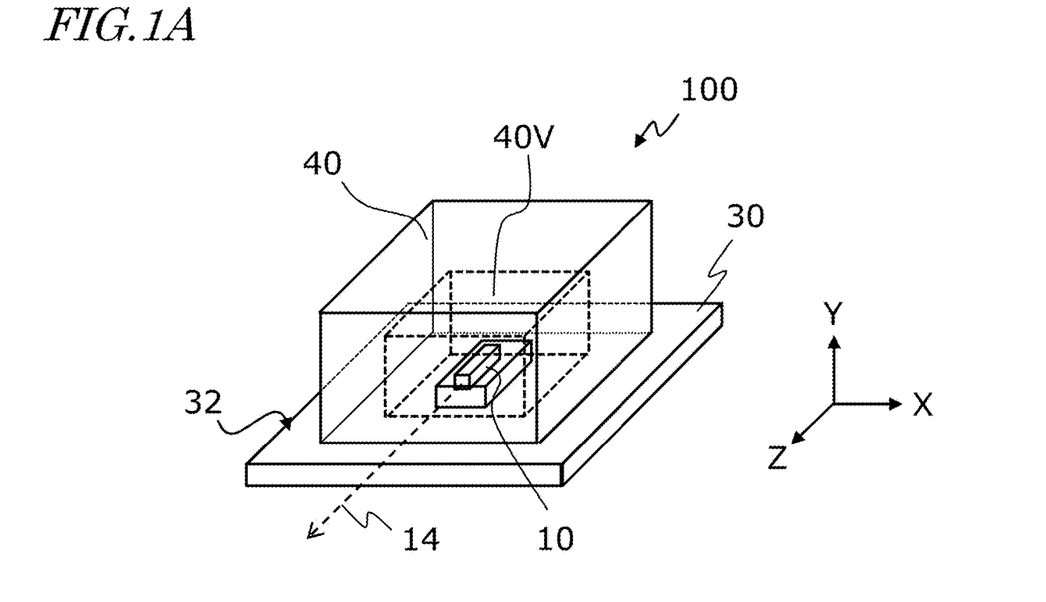
FIG. 1A is a perspective view schematically showing an example configuration of a light source device according to one embodiment of the present disclosure.
Figure 1B:
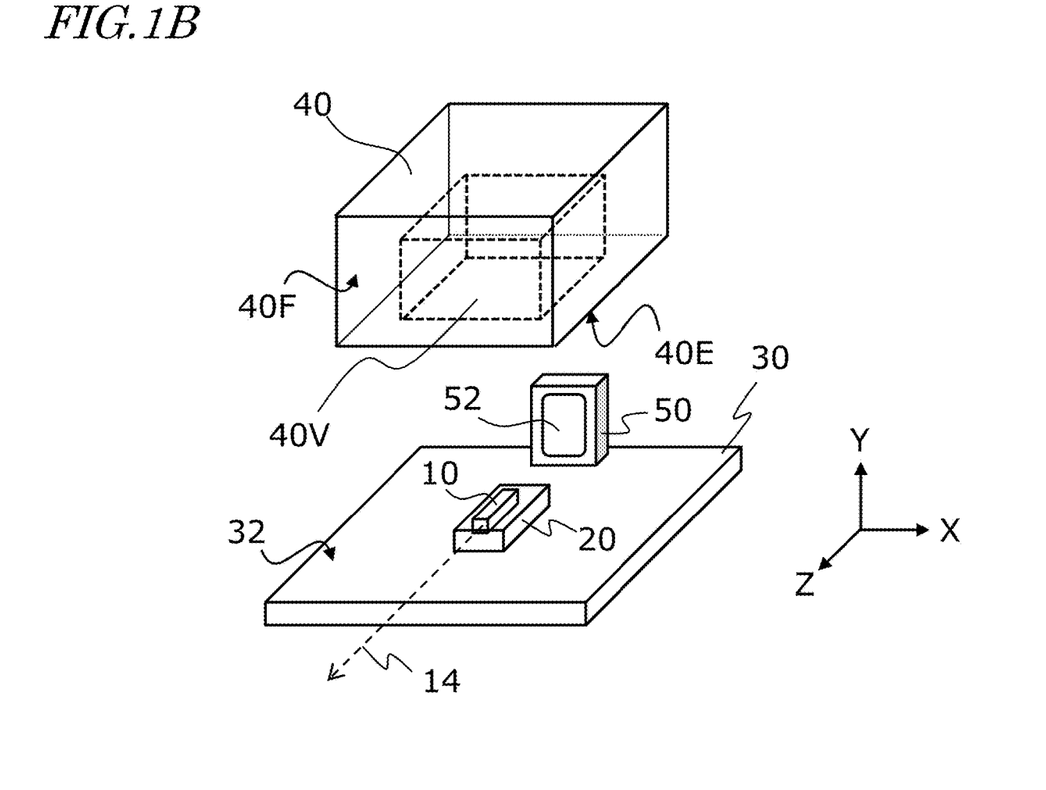
FIG. 1B is a perspective view schematically showing an example configuration of a light source device according to one embodiment while in a production process thereof.

With reference to FIG. 1A and FIG. 1B, a light source device according to one embodiment of the present disclosure will be described below. FIG. 1A is a perspective view schematically showing an example configuration of a light source device 100 according to the present embodiment. FIG. 1B is a perspective view schematically showing an example configuration of the light source device 100 while in a production process thereof. In the figures, the X axis, the Y axis, and the Z axis, which are orthogonal to one another, are shown for reference sake.

The illustrated light source device 100 includes at least one laser diode 10, a substrate 30 directly or indirectly supporting the at least one laser diode 10, and a glass cap 40 that is fixed to the substrate 30 and covers the laser diode 10. Hereinafter, the glass cap 40 may be simply referred to as a "cap". The light source device 100 further includes a photodetector 50, as shown in FIG. 1B. The photodetector 50 is directly or indirectly supported by the substrate 30, and is located outside of the cap 40. The photodetector 50 includes a light-receiving element 52 that is configured to receive a portion of laser light 14 that is emitted from the laser diode 10. This enables monitoring of the laser light 14. The light-receiving element 52 may be a photoelectric transducer such as a photodiode. Operation of the photodetector 50 will be described below.

The cap 40 defines a recess 40V for accommodating the laser diode 10.

When the cap 40 is not fixed to the substrate 30, the recess 40V opens downward, as shown in FIG. 1B. The cap 40 includes a front glass wall 40F, through which laser light 14 emitted from the laser diode 10 is transmitted. The front glass wall 40F serves a great function for the operation of the photodetector 50, as will be described below.

The cap 40 has a lower end surface 40E that is bonded to a principal surface 32 of the substrate 30. The lower end surface 40E is located surrounding the opening of the recess 40V. While the recess 40V has a rectangular parallelepiped shape in the example shown in drawings, the recess 40V may have a shape other than a rectangular parallelepiped shape. A side of the recess 40V may have a length of, e.g., 1.0 mm or less, or may have a length greater than 1.0 mm.

For the laser diode 10, for example, a laser diode that radiates blue light, a laser diode that radiates green light, or a laser diode that radiates red light, etc., can be employed. Alternatively, a laser diode that radiates other color of light may be employed.

In the present specification, blue light refers to light having an emission peak wavelength in a range of 420 nm to 494 nm, green light refers to light having an emission peak wavelength in a range of 495 nm to 570 nm, and red light refers to light having an emission peak wavelength in a range of 605 nm to 750 nm.

Examples of laser diodes that emit blue light or laser diodes that emit green light include laser diodes containing a nitride semiconductor. Examples of a nitride semiconductor include GaN, InGaN, and AlGaN. Examples of laser diodes that emit red light include laser diodes containing an InAlGaP-based or GaInP-based semiconductor, a GaAs-based or AlGaAs-based semiconductor, etc.

Laser light 14 radiated from the laser diode 10 is divergent, and creates a far field pattern (hereinafter abbreviated as "FFP") of an elliptical shape at a surface that is parallel to an emission end surface through which the laser light 14 is emitted. The FFP is determined by an optical intensity distribution of the laser light 14 at a position apart from the emission end surface. In this optical intensity distribution, a portion having an intensity that is $1/e^2$ or greater with respect to the peak intensity value may be referred to as a "beam cross section."

While an edge-emission type laser diode having an end surface through which the laser light 14 is emitted is employed for the laser diode 10 in the present embodiment, a surface emitting type laser diode (VCSEL) may be employed for the laser diode 10. For simplicity, a center axis of the laser light 14 is indicated with a broken line in the drawing. The actual laser light 14, as described above, diverges and spreads out after being emitted through the end surface 12 of the laser diode 10. Therefore, the laser light 14 may be collimated or converged by an optical system including a lens or lenses, which are not shown. Such an optical system may be provided outside of the light source device 100. At least a portion of the optical system including lenses for collimation or convergence may be provided on the cap 40, or disposed within the recess 40V of the cap 40.

The center axis of the laser light 14 extends in a direction along the principal surface 32 of the substrate 30 (i.e., the Z axis direction). Laser light 14 emitted from the light source device 100 to the outside may be reflected in a direction e.g. perpendicular to the principal surface 32 of the substrate 30 by a mirror disposed outside the light source device 100.

In the example shown in drawings, the laser diode 10 is mounted on the principal surface 32 of the substrate 30 in a state of being secured on a submount 20. Without utilizing the submount 20, the laser diode 10 may be directly bonded to the principal surface 32 of the substrate 30 instead. In these drawings, illustration of a wiring for connecting the laser diode 10 to an external circuit is omitted.

Silicon or a ceramic may be used for a main material of the substrate 30. For the substrate 30, a material other than silicon and a ceramic may be used, and a metal may be used.

Examples of a main material of the substrate 30 include ceramics such as aluminum nitride, silicon nitride, aluminum oxide, and carbon nitride; metals such as copper, aluminum, iron; and composites such as copper molybdenum, copper-diamond composite materials, and copper tungsten.

A plurality of metal layers may be disposed on each of an upper surface and a lower surface of the substrate 30. A metal may be disposed to extend inside the substrate 30, which allows metal layers on the upper surface to be electrically connected to metal layers on the lower surface. On the lower surface of the substrate 30, metal layers that are not electrically connected to the metal layers on the upper surface may be disposed. Examples of the substrate 30 include a multilayered ceramic substrate that includes interconnects on the inside and/or the outside.

The submount 20 has a lower surface, an upper surface, and lateral surfaces, and may exemplarily have a rectangular-parallelepiped shape. The submount 20 may have any other appropriate shape. The submount 20 may be made of silicon, a silicon nitride, an aluminum nitride, or a carbon nitride, for example. Metal layers for connecting the laser diode 10 to interconnects on the substrate 30 may be disposed on the upper surface of the submount 20.

The cap 40 is secured to the substrate 30 to cover the laser diode 10 supported by the substrate 30. In the example in drawings, the lower end surface 40E of the cap 40 is bonded to the principal surface 32 of the substrate 30. Such bonding may be achieved via a layer of inorganic material (e.g. a metal) or organic material. Thus, the laser diode 10 may be sealed airtight. The light source device 100 depicted in FIG. 1A may be referred to as a "semiconductor laser package." While a single light source device 100 includes a single laser diode 10 in the example shown in the drawing, other configurations may be employed in embodiments of the present disclosure. A plurality of laser diodes 10 may be arranged inside a single recess 40V of the cap 40. The plurality of laser diodes 10 may be disposed parallel to one another, so as to emit the laser light 14 in the same direction.

Figure 2:
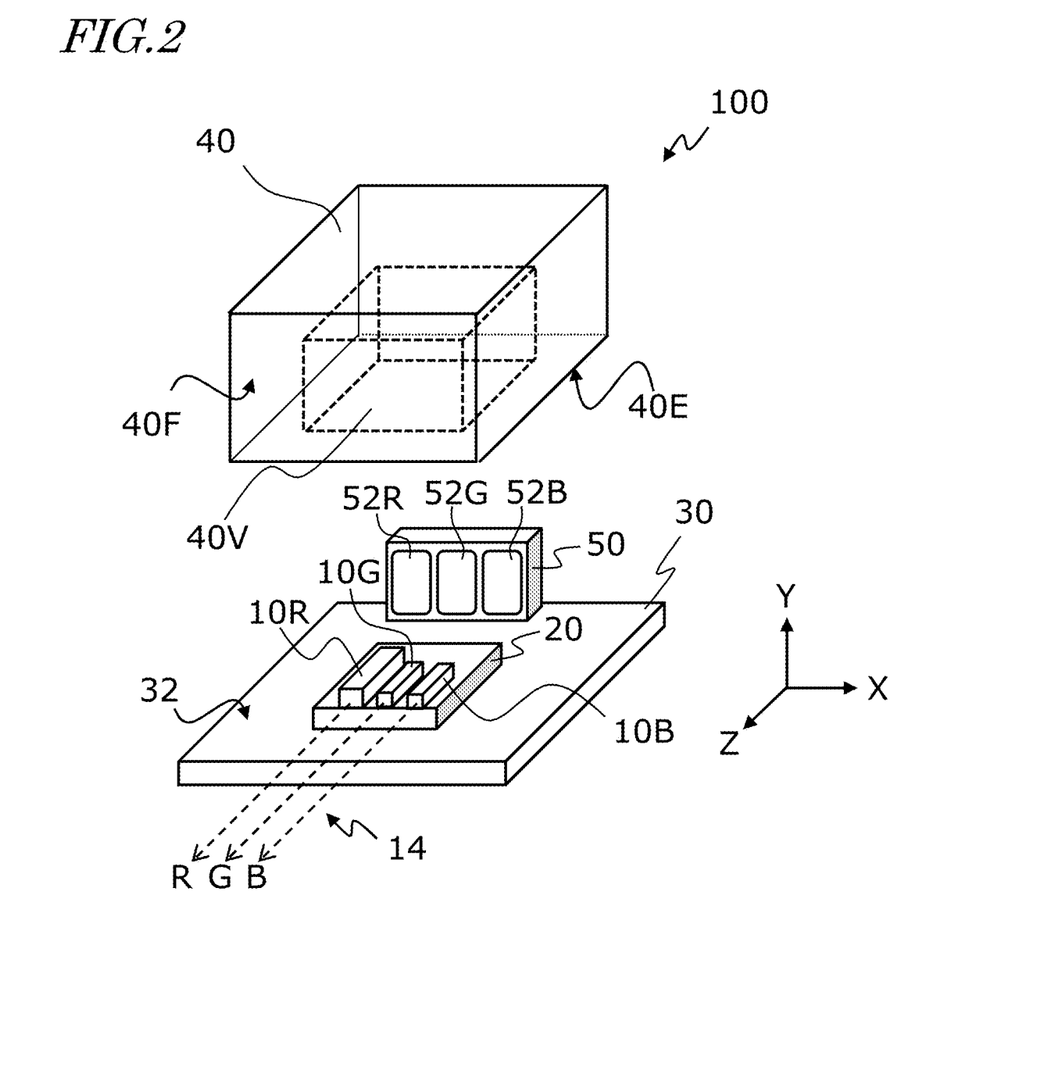
FIG. 2 is a perspective view schematically showing another example configuration of a light source device according to one embodiment of the present disclosure while in a production process thereof.

FIG. 2 is a perspective view schematically showing another example configuration of a light source device according to one embodiment of the present disclosure. In this example, the substrate 30 includes three laser diodes 10R, 10G and 10B that are arranged on a single submount 20. The laser diodes 10R, 10G and 10B respectively radiate laser light 14 of red, green, and blue colors. The laser diodes 10R, 10G and 10B may be housed inside the single cap 40 and sealed airtight. Two or more submounts 20 may be employed, and the submounts 20 are provided separately for respective ones of the laser diodes 10R, 10G and 10B.

The laser light 14 radiated from each of the laser diodes 10R 10G and 10B may be combined into a coaxial beam by a beam combiner not shown. The laser diodes 10R, 10G and 10B may radiate the laser light 14 with respectively different timings, or all simultaneously. Emission of the laser light 14 is controlled by a driving circuit not shown.

The light source device 100 shown in FIG. 2 also includes a photodetector 50. This photodetector 50 is also directly or indirectly supported by the substrate 30, and is located outside of the cap 40. The photodetector 50 includes light-receiving elements 52R, 52G and 52B. The light-receiving elements 52R, 52G and 52B include color filters that selectively transmit red light, green light, and blue light, respectively. Each of the light-receiving elements 52R, 52G and 52B receives a portion of the laser light 14 that is radiated from the laser diode 10R, 10G or 10B, respectively, thus to monitor the laser light 14.

An additional laser diode that radiates, e.g., yellow laser light may be mounted inward of a single cap 40. Alternatively, a plurality of caps 40 may be connected onto a single substrate 30, with one or more laser diodes being housed inward of each cap 40.

Figure 3A:
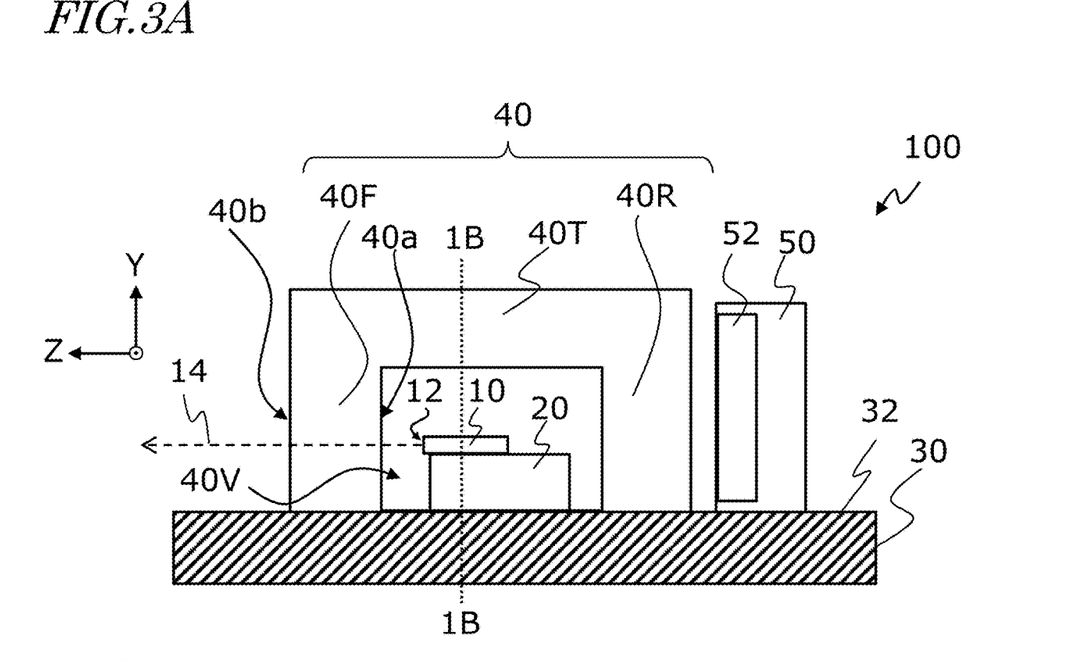
FIG. 3A is a cross-sectional view schematically showing a light source device according to one embodiment as taken parallel to the YZ plane.
Figure 3B:
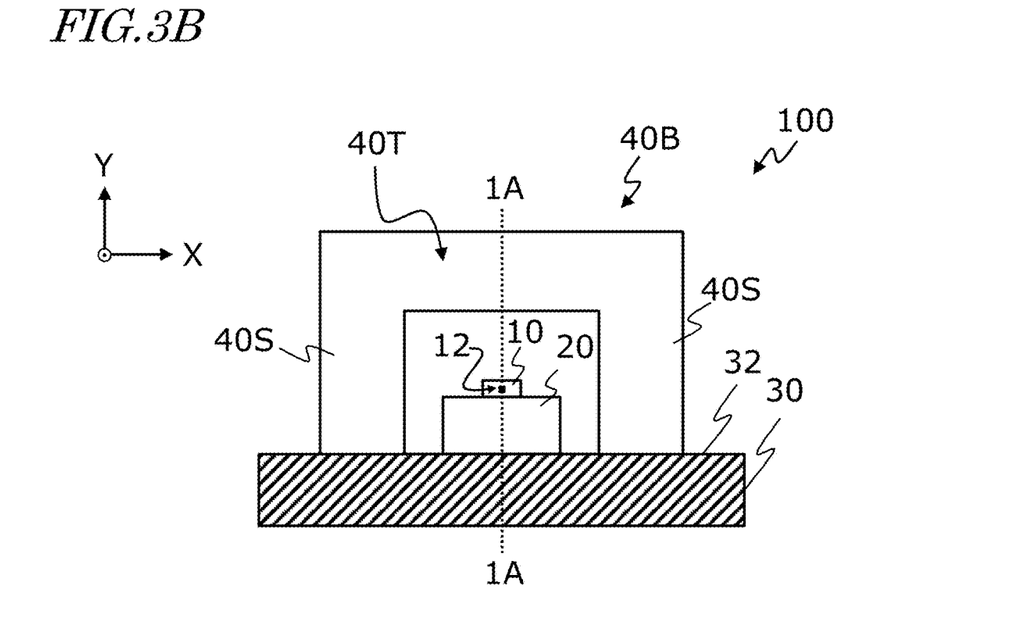
FIG. 3B is a cross-sectional view schematically showing a light source device according to one embodiment as taken parallel to the XY plane.

Next, with reference to FIG. 3A and FIG. 3B, an example configuration of the light source device 100 according to the present embodiment will be described in detail. FIG. 3A is a diagram schematically showing a cross section parallel to the YZ plane, the cross section containing the center axis of the laser light 14. FIG. 3B is a cross-sectional view taken along line 1B-1B in FIG. 3A, showing a cross section that is parallel to the XY plane. FIG. 3A corresponds to a cross-sectional view along line 1A-1A in FIG. 3B.

In the present embodiment, the cap 40 includes the front glass wall 40F, which transmits the laser light 14 that is emitted from the laser diode 10. The front glass wall 40F is disposed at a position on the substrate 30 that intersects the path of the laser light 14. The front glass wall 40F includes: an incident surface 40a that is struck by the laser light 14 emitted from the laser diode 10; and an emission surface 40b from which the laser light 14 emitted from the laser diode 10 exits. Moreover, in the example shown in FIG. 3A, the cap 40 includes a rear glass wall 40R that is located on an opposite side to the front glass wall 40F with respect to the laser diode 10. Furthermore, the cap 40 includes an intermediate portion 40B having a cross section in the shape like the alphabetical letter "C" as shown in FIG. 3B. The intermediate portion 40B includes: a pair of lateral wall portions 40S that are located at lateral sides with respect to the laser diode 10; and a cover portion 40T that is located above the laser diode 10 and connects together the pair of lateral wall portions 40S. The pair of lateral wall portions 40S and the cover portion 40T do not need to be light-transmissive, the intermediate portion 40B does not need to be made of a glass. In the present embodiment, the cap 40 includes a light-transmissive portion that can transmit any laser light that is reflected off the front glass wall 40F.

While the front glass wall 40F, the rear glass wall 40R, and the intermediate portion 40B are formed in a monolithic and continuous structure in the present embodiment, the front glass wall 40F, the rear glass wall 40R, and the intermediate portion 40B may be individual glass parts that are connected together. Such connecting between the glass parts may be performed through anodic bonding, for example. A thin metal layer may be disposed at connecting portion between the glass parts. Accordingly, a "glass cap" as used herein encompasses not only a cap that is entirely made of a glass, but also, for example, a cap in which a portion other than the front glass wall 40F and the rear glass wall 40R is made of a material different from glass. An example of a method for producing the cap 40 is described in, for example, Japanese Patent Application No. 2019-171454, the entire disclosure of which is incorporated herein by reference.

The glass portion of the cap 40 may be made of an alkaline glass and/or a non-alkaline glass. An "alkaline glass" in the present specification refers to a silicate compound glass that contains ions of an alkali metal element such as $Na^+$, $Ka^+$, and/or $Li^+$. A silicate compound glass containing an alkaline oxide at a concentration of 0.1 mass % or less will be referred to as a "non-alkaline glass" in the present specification. Examples of silicate compound glasses include silicate glass, borosilicate glass, and quartz glass.

In the example shown in FIG. 3A, the photodetector 50 is located on the rear side of the rear glass wall 40R, and is able to detect laser light that has been transmitted through the cap 40. More specifically, in the example shown in FIG. 3A, the photodetector 50 is configured to detect, of the laser light 14 having been emitted from the laser diode 10, a portion of the laser light 14 reflected at the front glass wall 40F and transmitted through the rear glass wall 40R. Depending on the size of the light-receiving element 52 or the position of the photodetector 50, the photodetector 50 may be able to detect light that has been transmitted through portions of the cap 40 other than the rear glass wall 40R. In general, a large portion of the laser light that is reflected at the front glass wall 40F is transmitted through the rear glass wall 40R, and accordingly the photodetector 50 is at the rear side of the rear glass wall 40R in one typical example.

Thus, with the photodetector 50 disposed outside the cap 40, the cap 40 does not need to have a size that allows for accommodating the photodetector 50 inside the cap 40, and the size of the cap 40 can be reduced. Even when the photodetector 50 is large relative to the laser diode 10, disposing the photodetector 50 on the rear side of the cap 40 allows for facilitating establishing electrical connection at a position that does not obstruct travel of the laser light, which can facilitate manufacturing.

The laser light 14 emitted from the laser diode 10, when being incident on the incident surface 40a of the front glass wall 40F, passes through a first interface (incident surface 40a) that exists between a gas and a solid. The "gas" may be air or any inert gas, etc., existing inside the recess 40V. The "solid" is the glass constituting the front glass wall 40F. The gas such as air has a refractive index of about 1.0, while the glass has a refractive index of, e.g., 1.4 or higher. Thus, the first interface is an interface between a dielectric (air) of a relatively low refractive index and a dielectric (glass) of a relatively high refractive index. Such an interface is called a "Low-to-High interface", and so-called "fixed end reflection" occurs at such an interface.

Accordingly, a portion of the laser light 14 is reflected at the first interface.

When the laser light 14 is transmitted inside the front glass wall 40F and emitted from the emission surface 40b, the laser light 14 passes through a second interface (emission surface 40b) between the solid and the gas. The second interface is an interface between a dielectric (glass) of a relatively high refractive index and a dielectric (air) of a relatively low refractive index. Such an interface is called a "High-to-Low interface", and so-called "free end reflection" occurs at such an interface. A portion of the laser light 14 is reflected also at the second interface.

Thus, the proportion of the laser light 14 that is emitted from the laser diode 10 and is reflected off the front glass wall 40F is determined by the reflectances of the incident surface 40a and the emission surface 40b of the front glass wall 40F. As will be described below, the reflectances of the incident surface 40a and the emission surface 40b, i.e., the reflectances at the first and second interfaces, can be adjusted using optical films each being composed of a single dielectric layer or a plurality of stacked dielectric layers, for example. Because reflectance depends on the wavelength of light, the term "reflectance" as used in the present disclosure refers to a reflectance of laser light (e.g. emitted from the laser diode 10) at a peak wavelength thereof.

Figure 4:
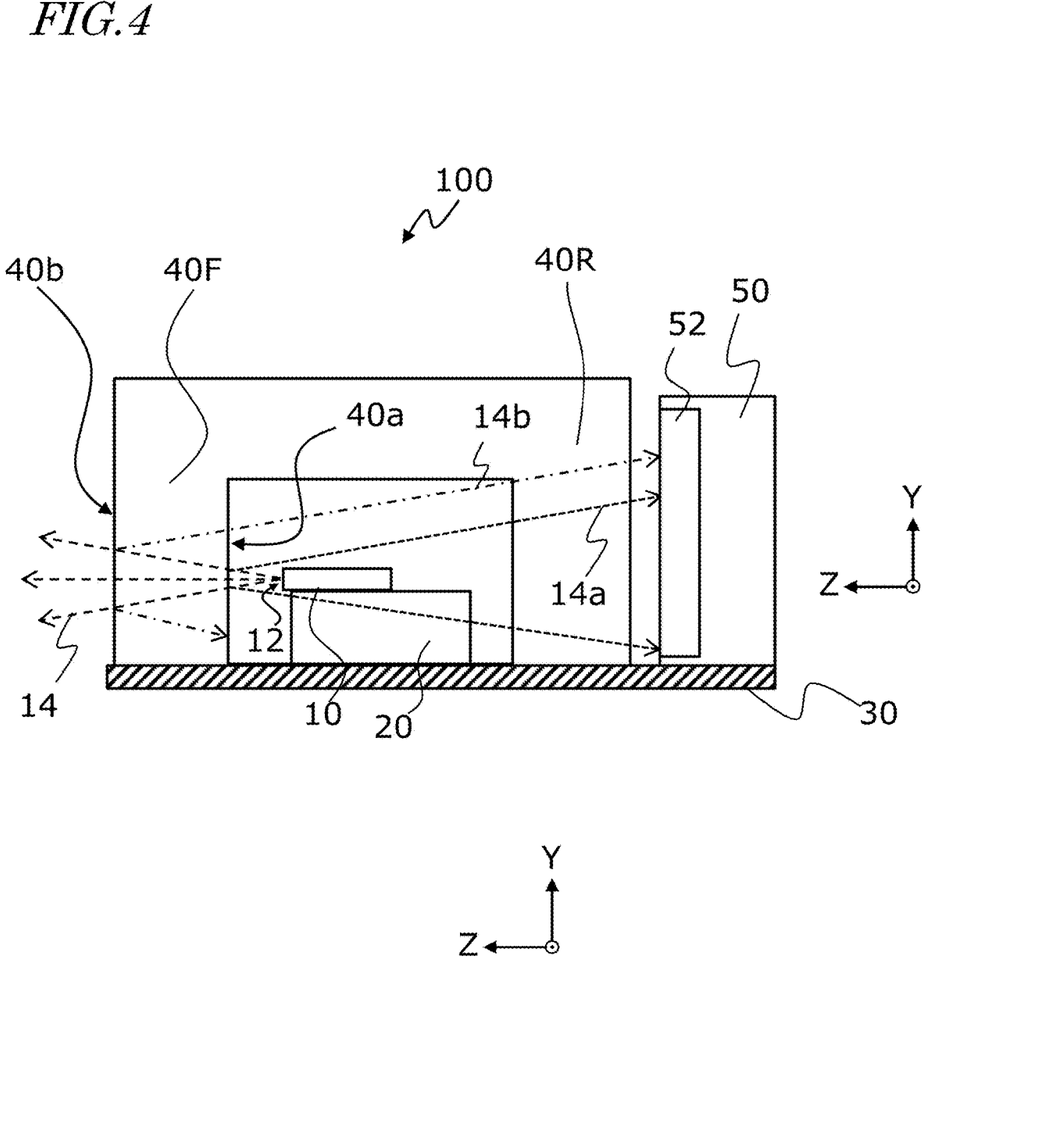
FIG. 4 is a cross-sectional view schematically showing incidence of monitoring light on a photodetector in a light source device according to one embodiment.

Next, a description with reference to FIG. 4 will be given. FIG. 4 is a cross-sectional view schematically showing incidence of monitoring light on the photodetector 50 in the light source device 100 according to the present embodiment. In FIG. 4, the laser light 14a that is reflected at the incident surface 40a of the front glass wall 40F and the laser light 14*b* that is reflected at the emission surface 40*b* are schematically indicated by a few representative rays. Although the actual rays will be refracted at the interface between the cap 40 and the air, such refraction is not illustrated for simplicity. As described above, the laser light 14 that is radiated from the laser diode 10 is divergent, and creates an FFP of an elliptical shape at a plane that is parallel to the emission end surface 12 of the laser light 14. The major axis of the ellipse is parallel to the direction in which the layers of the laser diode 10 are stacked.

In the example arrangement in FIG. 4, the major axis of the ellipse extends in the Y axis direction. Therefore, a portion of the laser light 14*a* that is reflected at the incident surface 40*a* of the front glass wall 40F and a portion of the laser light 14*b* that is reflected at the emission surface 40*b* can reach the photodetector 50, without being shielded by the laser diode 10 and the submount 20.

In order to perform highly accurate monitoring, it is preferable to obtain a greater amount of signal component than a noise component. The higher the reflectance of the incident surface 40*a* of the front glass wall 40F and the reflectance of the emission surface 40*b* of the front glass wall 40F, the greater the intensity of the laser light 14*a*, 14*b* that is incident on the light-receiving element 52 of the photodetector 50. However, the lower the reflectance of the incident surface 40*a* of the front glass wall 40F and the reflectance of the emission surface 40*b* of the front glass wall 40F, the higher the optical intensity of the laser light 14 that is extracted from the light source device 100 to be used. Therefore, the reflectance of the incident surface 40*a* of the front glass wall 40F and the reflectance of the emission surface 40*b* of the front glass wall 40F may be adjusted so as to enable a necessary degree of monitoring while realizing a sufficiently high optical intensity for the laser light 14.

In some conventional techniques, a light leaking from, instead of the emission end surface 12 of the laser diode 10, an end surface of the laser diode 10 opposite to the emission end surface 12, i.e., the rear end face, is utilized as a monitoring light. However, if the surface state of the emission end surface 12 changes during laser operation, such a change may not be detected from the intensity of the monitoring light. Also, when utilizing the light leaking from the rear end surface as monitoring light, due to a high mirror reflectance of the rear glass wall 40R, even a slight change in reflectance may result in a great change in the amount of light entering the photodetector 50. Monitoring the reflected light that is a portion of the laser light 14 emitted from the emission end surface 12 of the laser diode 10 as in certain embodiments of the present disclosure allows for reducing such disadvantages.

Figure 5:
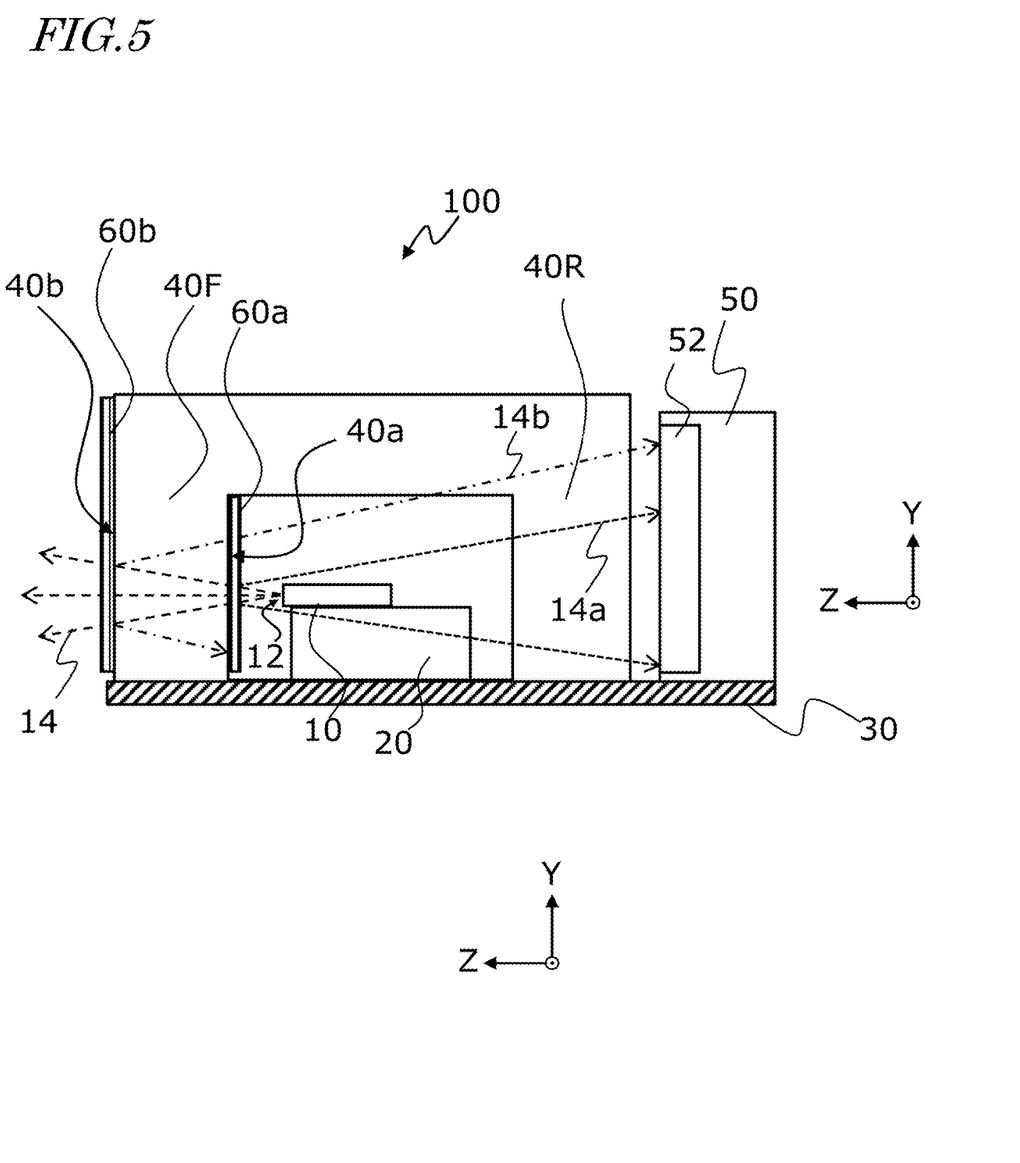
FIG. 5 is another cross-sectional view schematically showing incidence of monitoring light on a photodetector in a light source device according to one embodiment.

With reference to FIG. 5, an example configuration of the light source device 100 in which a reflectance of each of the incident surface 40*a* and the emission surface 40*b* of the front glass wall 40F are adjusted will be described.

In the example of FIG. 5, a first reflectance adjustment layer 60*a* is disposed on the incident surface 40*a* of the front glass wall 40F. A second reflectance adjustment layer 60*b* is disposed on the emission surface 40*b* of the front glass wall 40F. Each of the first reflectance adjustment layer 60*a* and the second reflectance adjustment layer 60*b* may be, for example, a single dielectric layer or a multilayer dielectric film that is composed of a plurality of stacked dielectric layers. Each of the first reflectance adjustment layer 60*a* and the second reflectance adjustment layer 60*b* has a structure similar to the structure of an optical film that is referred to as an "antireflection coating". An antireflection coating that are generally used has a very low reflectance, e.g. 0.5% or less, in order to reduce reflection as much as possible. On the other hand, in certain embodiments of the present disclosure, it is necessary that an amount of light needed for monitoring is reflected from the first interface and/or the second interfaces.

Accordingly, the reflectances of the first reflectance adjustment layer 60*a* and the second reflectance adjustment layer 60*b* are to be determined so as to result in a total of e.g. not less than 1% and not more than 10%.

In some embodiments, the reflectance of the first reflectance adjustment layer 60*a* is higher than the reflectance of the second reflectance adjustment layer 60*b*. In that case, so long as an amount of the laser light 14*a* necessary for monitoring can be reflected at the first reflectance adjustment layer 60*a* and can travel to the photodetector 50, the reflectance of the second reflectance adjustment layer 60*b* may be 0.5% or less, as in an antireflection coating that is generally used. Therefore, the second reflectance adjustment layer 60*b* having such a low reflectance can be formed in a similar manner to a general "antireflection coating".

In other embodiments, the reflectance of the second reflectance adjustment layer 60*b* is higher than the reflectance of the first reflectance adjustment layer 60*a*. In that case, so long as an amount of the laser light 14*b* necessary for monitoring can be reflected from the second reflectance adjustment layer 60*b* to the photodetector 50, the reflectance of the first reflectance adjustment layer 60*a* may be 0.5% or less, as in an antireflection coating that is generally used. Therefore, the first reflectance adjustment layer 60*a* having such a low reflectance can be formed in a similar manner to a general "antireflection coating".

Thus, the first reflectance adjustment layer 60*a* or the second reflectance adjustment layer 60*b* may have a very low reflectance similar to that of a conventional antireflection coating. Moreover, when the photodetector 50 is highly sensitive, or when the reflected light is efficiently incident on the light-receiving element 52 of the photodetector 50, both the first reflectance adjustment layer 60*a* and the second reflectance adjustment layer 60*b* may have a very low reflectance similar to that of a conventional antireflection coating.

Moreover, each of the first reflectance adjustment layer 60*a* and the second reflectance adjustment layer 60*b* does not need to be in the form of a coating. A minute irregular structure with a sub-wavelength size, e.g., a layer of nanoparticle powder or a moth-eye structure, may be formed on the incident surface 40*a* and/or the emission surface 40*b*.

Alternatively, modifying the incident surface 40*a* and/or the emission surface 40*b* to form a region of a lower refractive index on the glass surface than inside front glass wall 40F allows adjustment of reflectance. The first reflectance adjustment layer 60*a* and the second reflectance adjustment layer 60*b* can be realized by such modified regions formed on the glass surface. Moreover, various structures for enabling reflectance adjustments described above may be combined.

The first reflectance adjustment layer 60*a* and the second reflectance adjustment layer 60*b* may be selectively formed in regions that transmit the laser light 14, or may be extended to other regions, according to a production process.

Although not shown in FIG. 5, an antireflection coating(s) may be disposed on a surface of the rear glass wall 40R at an outer side of the cap 40 and/or on a surface of the rear glass wall 40R at an inner side of the cap 40. Such an antireflection coating(s) serves to efficiently allow the laser light 14*a*, 14*b* for monitoring to be incident on the light-receiving element 52 of the photodetector 50.

Hereinafter, with reference to FIGS. 6A, 6B, 6C and 6D, an example configuration that allows for reducing monitoring noises associated with the photodetector 50 will be described.

Figure 6A:
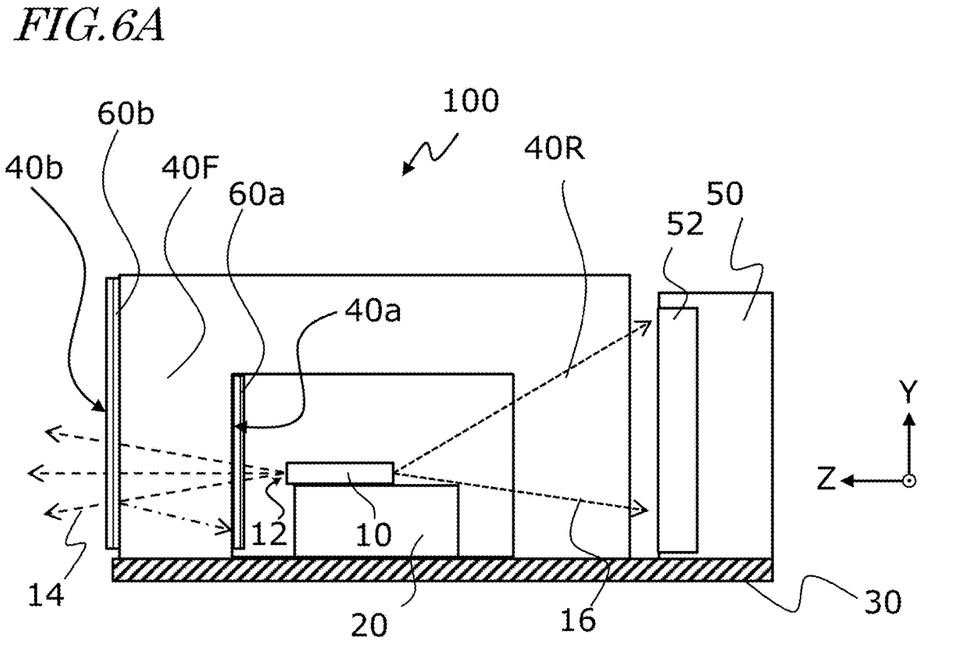
FIG. 6A is a cross-sectional view schematically showing non-monitoring light in a light source device according to one embodiment.

With reference to FIG. 6A, unnecessary light that is radiated from the laser diode 10 will be described. In general, from the laser diode 10, relatively weak non-laser light may be radiated in all directions. The "non-laser light" as used herein is not light that has become coherent through laser oscillation, but is incoherent light as in light that would be radiated by an LED. When such light 16 is incident on the photodetector 50, such light 16 behaves as a noise, which lowers the accuracy of monitoring the laser light 14.

Figure 6B:
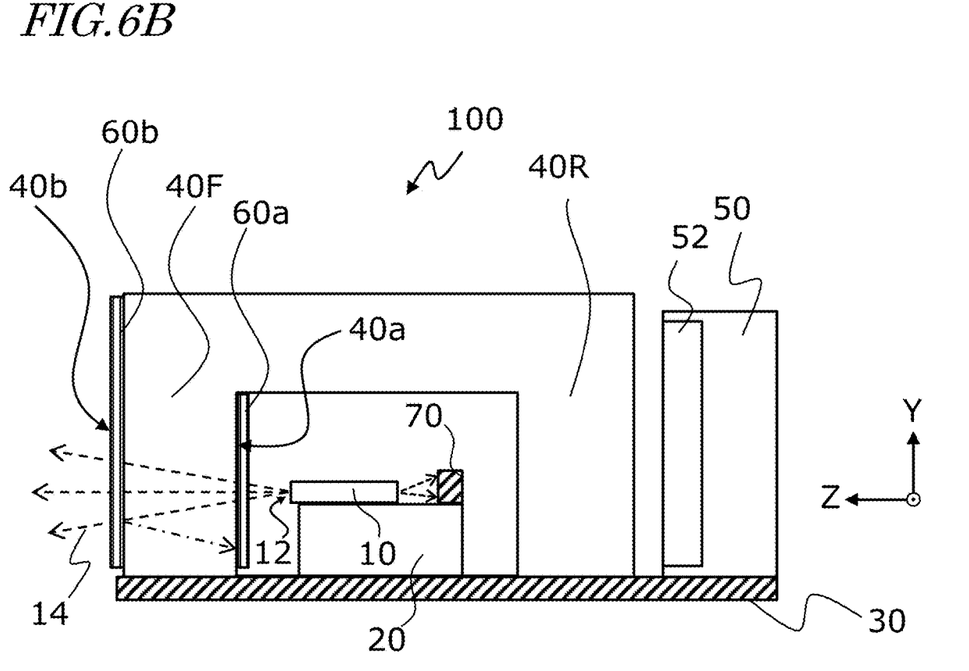
FIG. 6B is a cross-sectional view schematically showing a configuration that allows non-monitoring light to be intercepted in a light source device according to one embodiment.

Next, a description with reference to FIG. 6B will be given. FIG. 6B is a cross-sectional view showing a configuration that allows non-monitoring light to be intercepted in a light source device according to the present embodiment. The light source device 100 having configuration as described in the drawing includes a light-shielding member 70 that is disposed between the laser diode 10 and the photodetector 50. The light-shielding member 70 prevents or reduces incidence of non-laser light on the photodetector 50. This allows for increasing accuracy of monitoring the laser light 14.

Figure 6C:
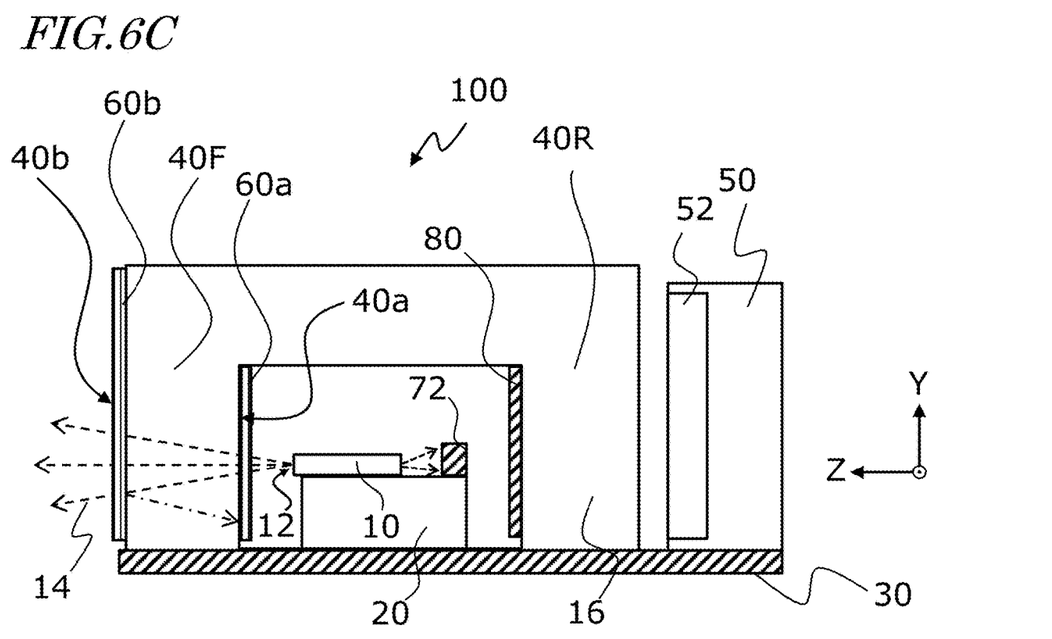
FIG. 6C is a cross-sectional view schematically showing the configuration of a variant of a light source device according to one embodiment.

FIG. 6C is a cross-sectional view showing the configuration of a variant example of a light source device according to the present embodiment. The light source device 100 in FIG. 6C includes a protective element 72 that is disposed in the cap 40. A Zener diode can be used for the protective element 72, and the protective element 72 is electrically connected in parallel with the laser diode 10, and may function as a protection circuit to reduce reverse voltage that may be applied to the laser diode 10 to a predetermined level or lower. In the light source device 100 of FIG. 6C, the protective element 72 serves as a light-shielding member 70. In the case where the submount 20 is disposed in the cap 40 to be located between the laser diode 10 and the substrate 30, a portion of the submount 20 may include a protrusion serving as the light-shielding member 70.

The light source device 100 of FIG. 6C further includes a polarizer 80 that is disposed in front of the photodetector 50. The relatively weak non-laser light that is radiated from the laser diode 10 in all directions is unpolarized light, and therefore the intensity of the non-laser light can be reduced to a half by the polarizer 80. The polarizer 80 may be disposed inside the cap 40, as illustrated in FIG. 6C. The transmission axis of the polarizer 80 is aligned with the polarization direction of the laser light 14 emitted from the laser diode 10. A reflected light component of the laser light 14 (which is emitted from the laser diode 10 and reflected at the front glass wall 40F) enters the polarizer 80 while retaining its polarization state. Therefore, such reflected light is transmitted through the polarizer 80, and is properly detected by the photodetector 50.

Figure 6D:
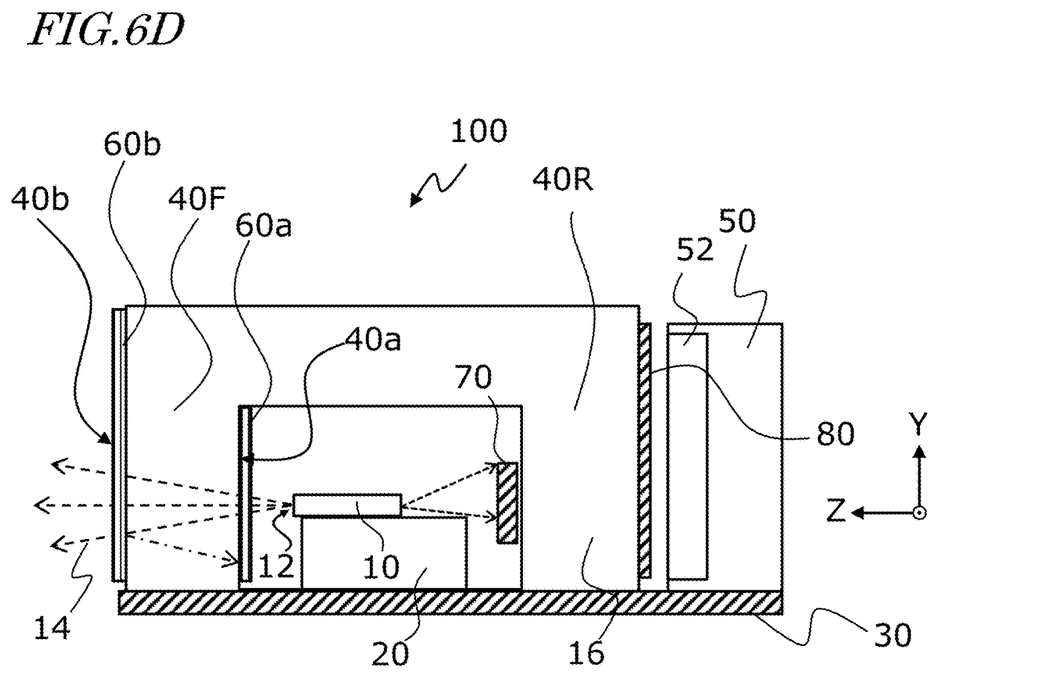
FIG. 6D is a cross-sectional view schematically showing the configuration of another variant of a light source device according to one embodiment.

FIG. 6D is a cross-sectional view showing the configuration of another variant of a light source device according to the present embodiment. In the light source device 100 according to this variant, the light-shielding member 70 is fixed to the cap 40, or specifically, to the rear glass wall 40R. Also, the polarizer 80 is disposed at an outer side of the cap 40, in the light source device 100 according to this modified example. Alternatively, the polarizer 80 may be secured on in front of the photodetector 50.

While a gap exists between the photodetector 50 and the cap 40 in each of the example configurations described above, the photodetector 50 and the cap 40 may be disposed without such a gap is not essential. The photodetector 50 and the cap 40 may be in contact with each other.

Figure 7:
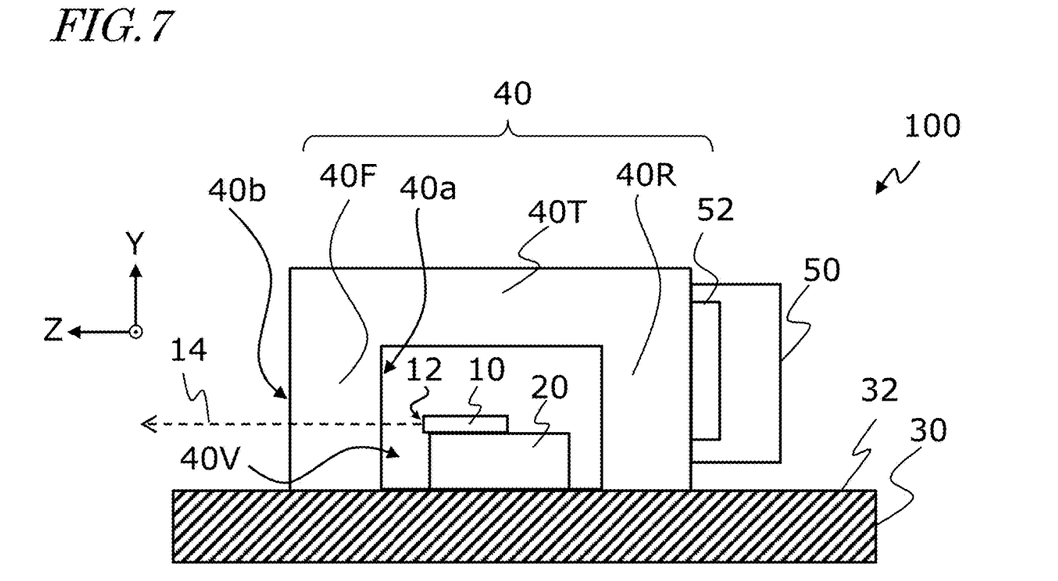
FIG. 7 is a cross-sectional view schematically showing another example configuration of a light source device according to one embodiment of the present disclosure.

FIG. 7 is a cross-sectional view schematically showing another example configuration of a light source device according to one embodiment of the present disclosure. In the light source device 100 of FIG. 7, the photodetector 50 is not supported by the substrate 30, but is secured to the cap 40, thus being indirectly supported by the substrate 30. The photodetector 50 may be thus supported by the cap 40.

Figure 8:
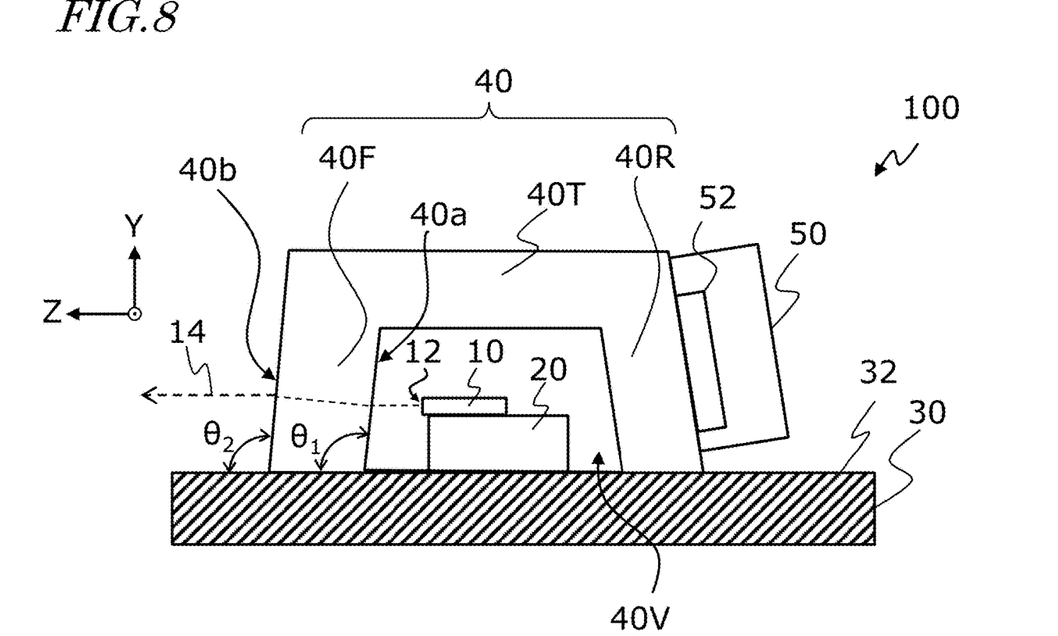
FIG. 8 is a cross-sectional view schematically showing still another example configuration of a light source device according to one embodiment of the present disclosure.

FIG. 8 is a cross-sectional view schematically showing still another example configuration of a light source device according to one embodiment of the present disclosure. In the light source device 100 of FIG. 8, the front glass wall 40F and the rear glass wall 40R of the cap 40 are inclined with respect to the normal direction (i.e., a direction parallel to the Y axis) of the principal surface 32 of the substrate 30. As shown in FIG. 8, angles of inclination of the incident surface 40a and the emission surface 40b are defined as $\theta_1$ and $\theta_2$, respectively. It is not necessary that $f_1$ and $\theta_2$ be equal. In the example shown in FIG. 8, both $f_1$ and $\theta_2$ are greater than 90°. Therefore, the incident surface 40a and the emission surface 40b are not orthogonal to the optical axis of the laser light 14 emitted from the laser diode 10. The center axis of the reflected light from the front glass wall 40F may also vary according to the angle of inclination. This may decrease the amount of light that is incident on the light-receiving element 52 of the photodetector 50. However, inclining the rear glass wall 40R, or adjusting the position and angle of the light-receiving element 52 of the photodetector 50 allows for sufficiently reducing such decrease in the amount of received light.

While both the front glass wall 40F and the rear glass wall 40R are inclined with respect to the Y axis direction in the example shown in FIG. 8, only one of the front glass wall 40F and the rear glass wall 40R may be inclined. When the front glass wall 40F is inclined as shown in FIG. 8, as indicated by broken lines in FIG. 8, the laser light 14 will be refracted at the first and second interfaces, so that the center axis of the laser light 14 emitted from the emission surface 40b will shift in such a direction along which height from the principal surface 32 of the substrate 30 is increased.

Figure 9:
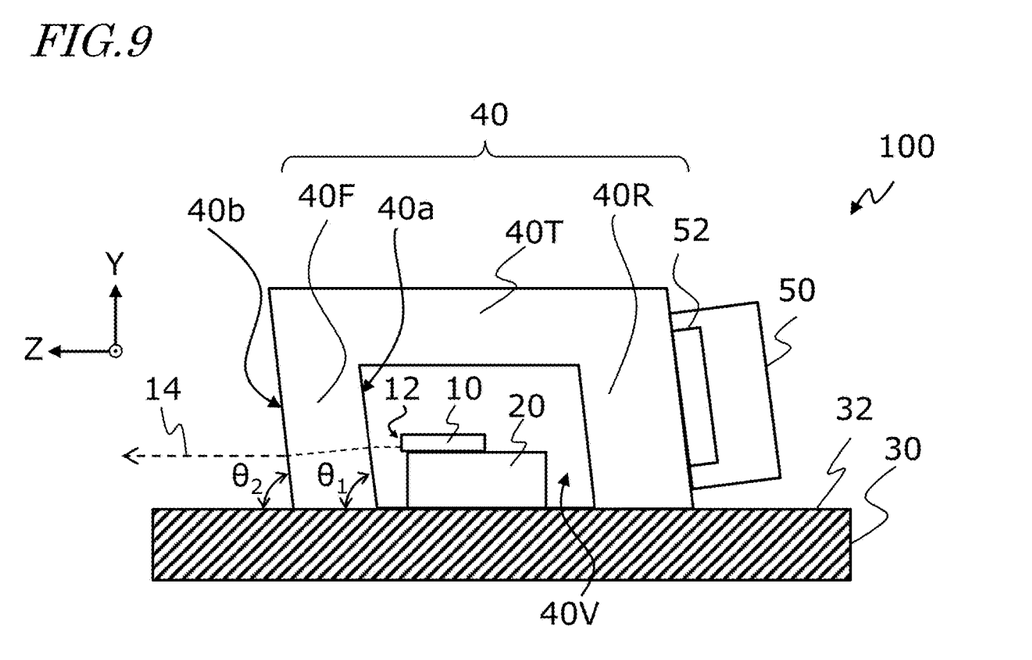
FIG. 9 is a cross-sectional view schematically showing still another example configuration of a light source device according to one embodiment of the present disclosure.

FIG. 9 is a cross-sectional view schematically showing still another example configuration of a light source device according to one embodiment of the present disclosure. In the light source device 100 of FIG. 9, too, the front glass wall 40F and the rear glass wall 40R of the cap 40 are inclined from the normal direction (i.e., a direction parallel to the Y axis) of the principal surface 32 of the substrate 30. More specifically, the front glass wall 40F is inclined in the opposite direction from the direction of inclination in the light source device 100 of FIG. 8. In other words, $f_1$ and $\theta_2$ are both smaller than 90°. Therefore, as indicated by broken lines in FIG. 9, the laser light 14 will be refracted at the first and second interfaces, so that the center axis of the laser light 14 emitted from the emission surface 40b will be shifted in such a direction along which a height from the principal surface 32 of the substrate 30 is decreased. While the rear glass wall 40R is inclined toward the laser diode 10 in the example configurations shown in FIG. 8 and FIG. 9, the rear glass wall 40R may be inclined in any appropriate direction.

Figure 10:
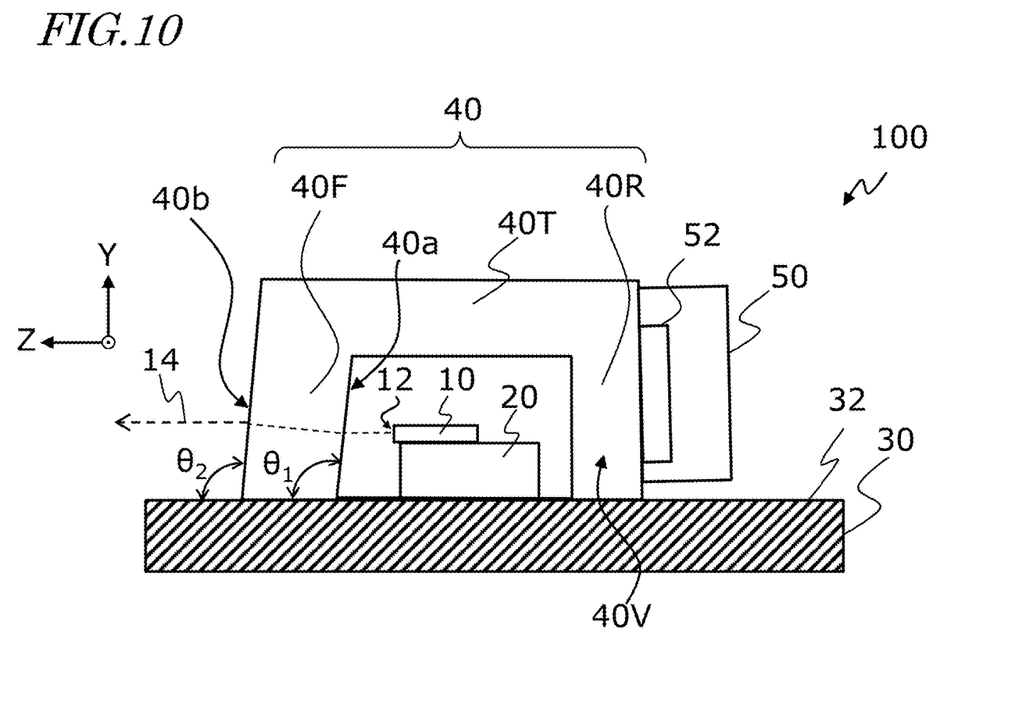
FIG. 10 is a cross-sectional view schematically showing still another example configuration of a light source device according to one embodiment of the present disclosure.

FIG. 10 is a cross-sectional view schematically still another example configuration of a light source device according to one embodiment of the present disclosure. In the light source device 100 shown in FIG. 10, the front glass wall 40F of the cap 40 is inclined with respect to the normal direction (i.e., a direction parallel to the Y axis) of the principal surface 32 of the substrate 30, while the rear glass wall 40R is not inclined. Thus, the cap 40 may have a variety of shapes. When necessary, one or more lenses may be attached to a portion of the cap 40. Examples of such a lenses include: a lens that collimates the laser light 14 emitted from the laser diode 10, and a lens on which the laser light 14a, 14b is incident and converges on the light-receiving element 52 of the photodetector 50.

In any of the implementations above, the photodetector 50 is disposed outside the cap 40; therefore, the size of the recess 40V shown in e.g. FIG. 1B can be reduced without being constrained by the size of the photodetector 50. Also, wirings for connecting the photodetector 50 to an electronic circuit that are not shown in the drawing do not need to be provided inside the cap 40, which allows for simplifying the wiring structure inside the cap 40 and on the substrate 30. This is also advantageous for reduction in size of the light source device.

A light source device according to certain embodiments of the present disclosure can monitor the output power of laser light with a high accuracy, and is appropriate for reduction in size, and therefore is preferably used for a small-sized light source for a head-mounted display or the like.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source device comprising:
   a laser diode configured to emit laser light;
   a substrate directly or indirectly supporting the laser diode;
   a glass cap secured to the substrate and covering the laser diode, the glass cap comprising a front glass wall configured to transmit the laser light that is emitted from the laser diode, the front glass wall having an incident surface on which the laser light is incident and an emission surface from which the laser light exits; and
   a photodetector directly or indirectly supported by the substrate and located outside of the glass cap; wherein:
   the photodetector is configured to detect light that is reflected at the front glass wall and transmitted through the glass cap;
   the glass cap comprises a rear glass wall located on a side opposite the front glass wall with respect to the laser diode; and
   the photodetector is located on a rear side of the rear glass wall and is configured to detect the light transmitted through the rear glass wall.

2. The light source device of claim 1, wherein a reflectance adjustment layer is disposed on the incident surface and/or the emission surface of the front glass wall.

3. The light source device of claim 1, comprising a light-shielding member disposed between the laser diode and the photodetector.

4. The light source device of claim 3, comprising:
   a protective element that is disposed in the glass cap and is electrically connected to the laser diode;
   wherein the protective element serves as the light-shielding member.

5. The light source device of claim 3, comprising:
   a submount that is disposed in the glass cap and is located between the laser diode and the substrate;
   wherein a portion of the submount comprises a protrusion that serves as the light-shielding member.

6. The light source device of claim 1, comprising a polarizer disposed in front of the photodetector.

7. The light source device of claim 6, wherein the polarizer is disposed at an inner side of the glass cap.

8. The light source device of claim 6, wherein a transmission axis of the polarizer is aligned with a polarization direction of the laser light that is emitted from the laser diode.

9. The light source device of claim 1, wherein:
   the photodetector is directly attached to the rear side of the rear glass wall.

10. The light source device of claim 1, wherein an antireflection coating is disposed on a surface of the rear glass wall located at an outer side of the glass cap and/or on a surface of the rear glass wall located at an inner side of the glass cap.

* * * * *